(12) United States Patent
Ariga et al.

(10) Patent No.: US 10,886,693 B2
(45) Date of Patent: Jan. 5, 2021

(54) OPTICAL MODULE

(71) Applicant: FURUKAWA ELECTRIC CO., LTD., Tokyo (JP)

(72) Inventors: Maiko Ariga, Tokyo (JP); Yuta Ishige, Tokyo (JP); Masaki Iwama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/538,151

(22) Filed: Aug. 12, 2019

(65) Prior Publication Data

US 2019/0363510 A1 Nov. 28, 2019

Related U.S. Application Data

(63) Continuation of application No. PCT/JP2018/004898, filed on Feb. 13, 2018.

(30) Foreign Application Priority Data

Feb. 14, 2017 (JP) .................................. 2017-024655

(51) Int. Cl.
 *H01S 5/00* (2006.01)
 *H01S 5/022* (2006.01)
 (Continued)

(52) U.S. Cl.
 CPC ...... *H01S 5/02208* (2013.01); *H01S 5/02248* (2013.01); *H01S 5/02415* (2013.01);
 (Continued)

(58) Field of Classification Search
 CPC ............. H01S 5/02208; H01S 5/02415; H01S 5/02438; H01S 5/02476; H01S 5/0687;
 (Continued)

(56) References Cited

U.S. PATENT DOCUMENTS

| 5,812,581 A * | 9/1998 | Cox ...................... H01S 5/0264 372/109 |
| 6,323,987 B1 * | 11/2001 | Rinaudo ............... G01J 9/0246 250/201.9 |

(Continued)

FOREIGN PATENT DOCUMENTS

| CN | 102299477 A | 12/2011 |
| CN | 204258035 U | 4/2015 |

(Continued)

OTHER PUBLICATIONS

International Search Report dated May 15, 2018 in PCT/JP2018/004898 filed Feb. 13, 2018 (with English translation).

(Continued)

*Primary Examiner* — Kinam Park
(74) *Attorney, Agent, or Firm* — Oblon, McClelland, Maier & Neustadt, L.L.P.

(57) ABSTRACT

An optical module includes a housing and an optical element that is disposed in the housing and emits light in the housing, in which a partial area of a surface inside the housing serves as a reduced optical reflection area processed so as to absorb the light and have a rough surface.

16 Claims, 7 Drawing Sheets

(51) Int. Cl.
*H01S 5/024* (2006.01)
*H01S 5/0687* (2006.01)
*H01S 5/50* (2006.01)
*H01S 5/068* (2006.01)

(52) U.S. Cl.
CPC ...... *H01S 5/02438* (2013.01); *H01S 5/02476* (2013.01); *H01S 5/0687* (2013.01); *H01S 5/06817* (2013.01); *H01S 5/50* (2013.01); *H01S 5/02284* (2013.01); *H01S 5/02288* (2013.01)

(58) Field of Classification Search
CPC .... H01S 5/50; H01S 5/02284; H01S 5/02288; H01S 5/06817
See application file for complete search history.

(56) References Cited

U.S. PATENT DOCUMENTS

| | | | |
|---|---|---|---|
| 7,978,737 B2 | 7/2011 | De Gabory et al. | |
| 9,054,480 B2 | 6/2015 | Daiber | |
| 9,203,212 B2 | 12/2015 | Kurobe et al. | |
| 2001/0002942 A1* | 6/2001 | Fukutomi | G02B 6/4257 385/92 |
| 2007/0280306 A1* | 12/2007 | De Gabory | H01S 5/141 372/20 |
| 2009/0129427 A1* | 5/2009 | Ariga | H01S 5/02208 372/108 |
| 2011/0187465 A1* | 8/2011 | Youngner | H01S 5/02296 331/94.1 |
| 2013/0070170 A1* | 3/2013 | Namekata | G02F 1/133603 348/836 |
| 2015/0103853 A1* | 4/2015 | Kurobe | H01S 5/024 372/34 |
| 2016/0181762 A1* | 6/2016 | Dawson | G02B 6/42 372/6 |

FOREIGN PATENT DOCUMENTS

| | | |
|---|---|---|
| CN | 106099636 A | 11/2016 |
| JP | 9-148680 A | 6/1997 |
| JP | 11-74612 A | 3/1999 |
| JP | 2001-154067 A | 6/2001 |
| JP | 2005-19746 A | 1/2005 |
| JP | 2006-216695 A | 8/2006 |
| JP | 2006-216791 A | 8/2006 |
| JP | 2007-149932 A | 6/2007 |
| JP | 2008-153639 A | 7/2008 |
| JP | 4253027 B2 | 4/2009 |
| JP | 2016-111240 A | 6/2016 |
| JP | 2016-144823 A | 8/2016 |
| JP | 2016-189430 A | 11/2016 |
| WO | WO 2013/180291 A1 | 12/2013 |
| WO | WO 2016/129392 A1 | 8/2016 |

OTHER PUBLICATIONS

Written Opinion dated May 15, 2018 in PCT/JP201/8004898 filed Feb. 13, 2018.
Combined Chinese Office Action and Search Report dated Jun. 22, 2020, in Patent Application No. 201880010921.2 (with English translation), 17 pages.
Japanese Office Action dated Nov. 4, 2020 in corresponding Japanese Patent Application No. 2017-024655 (with English translation).

* cited by examiner

OPTICAL MODULE

CROSS-REFERENCE TO RELATED APPLICATION(S)

This application is a continuation of International Application No. PCT/JP2018/004898, filed on Feb. 13, 2018, which claims the benefit of priority of the prior Japanese Patent Application No. 2017-024655, filed on Feb. 14, 2017, the entire contents of which are incorporated herein by reference.

BACKGROUND

Some laser modules as light sources for optical communication achieve high output levels, each by using an integrated semiconductor laser device obtained by integrating a semiconductor laser with a semiconductor optical amplifier (SOA) (refer to, for example, Japanese Laid-open Patent Publication No. 2006-216791, Japanese Laid-open Patent Publication No. 2006-216695, and U.S. Pat. No. 9,054,480). In recent years, the semiconductor laser and the SOA have become to be driven at higher current levels for increasing the output level, and heat generation of the integrated semiconductor laser device has increased. In this case, the amount of the heat generation of the integrated semiconductor laser device increases, and a thermoelectric element may be difficult to appropriately adjust temperature (mainly by cooling). Therefore, a structure has been developed in which the semiconductor laser and the SOA are separated into separate elements, and are adjusted in temperature by individual separate thermoelectric elements (refer to International Patent Publication WO 2013/180291).

In an optical module such as a laser module, unwanted light, such as stray light, that is not used for any specific application may be generated and cause an adverse effect on an operation of the optical module. For example, when the laser module is provided therein with a photodiode (PD) that monitors an intensity of a laser beam in order to control the operation of the laser module, the accuracy of the monitoring may be reduced when the PD receives the stray light as noise light. In particular, since the stray light increases in intensity as the laser module provides a higher output, the accuracy of the monitoring drops more significantly. Therefore, to reduce such unwanted light, techniques have been disclosed that provide a member that absorbs or scatters the unwanted light or apply a coating that absorbs the unwanted light in a housing of the optical module (refer to Japanese Laid-open Patent Publication No. 2001-154067, Japanese Patent No. 4253027, and Japanese Laid-open Patent Publication No. 2016-189430).

SUMMARY

According to a first aspect of the present disclosure, an optical module is provided which includes a housing; and an optical element disposed in the housing and configured to emit light in the housing. In the optical module, a partial area of a surface inside the housing serves as a reduced optical reflection area processed so as to absorb the light and have a rough surface.

According to a second aspect of the present disclosure, an optical module is provided which includes a housing; an optical element disposed in the housing and configured to emit light in the housing; and a member disposed in the housing. In the optical module, a partial area of a surface of the member serves as a reduced optical reflection area processed so as to absorb the light and have a rough surface.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Figure 1A:
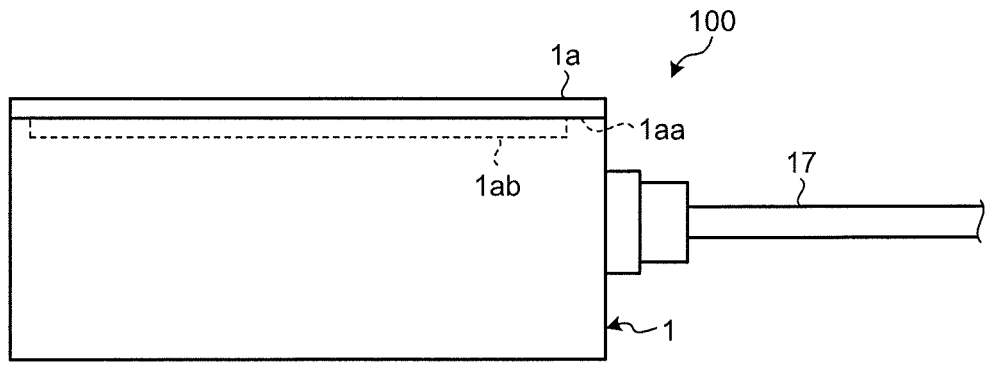
FIG. 1A is a schematic diagram illustrating a configuration of an optical module according to a first embodiment of the present disclosure.

The following describes embodiments of the present disclosure with reference to the drawings. The embodiments do not limit the present disclosure. In the description of the drawings, the same or corresponding elements are denoted by the same reference numerals as appropriate. It should be noted that the drawings are merely schematic, and, for example, relations among dimensions of the elements and ratios among the elements may differ from actual relations and ratios. The drawings may also include portions different from one another in the relations among dimensions and the ratios.

First Embodiment

Figure 1B:
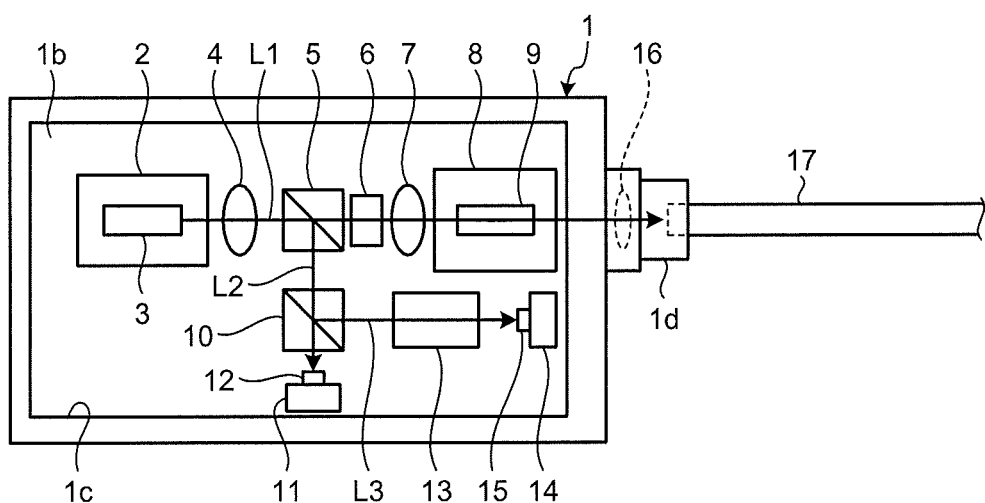
FIG. 1B is another schematic diagram illustrating the configuration of the optical module according to the first embodiment.
Figure 1C:
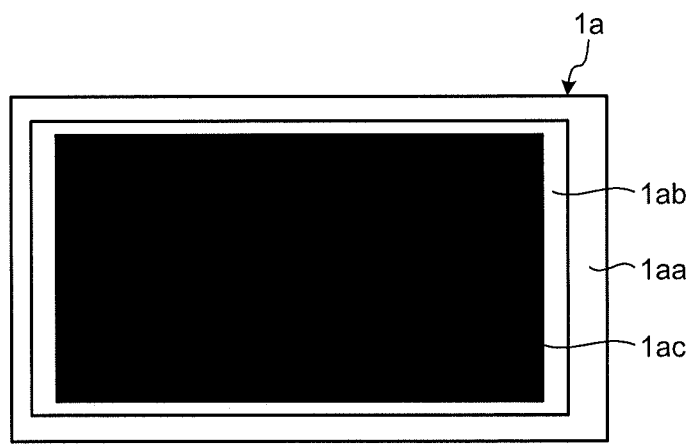
FIG. 1C is still another schematic diagram illustrating the configuration of the optical module according to the first embodiment.

FIGS. 1A to 1C are schematic diagrams each illustrating a configuration of a semiconductor laser module serving as an optical module according to a first embodiment of the present disclosure. As illustrated in a side view in FIG. 1A, a semiconductor laser module 100 is provided with a housing 1 that includes a lid 1a. As illustrated in FIG. 1B, which is a top view of the semiconductor laser module 100 with the lid 1a removed from the housing 1, the semiconductor laser module 100 includes a submount 2, a laser element 3, a collimator lens 4, a beam splitter 5, an optical isolator 6, a condenser lens 7, a submount 8, an SOA 9, a beam splitter 10, a photodiode (PD) 12 supported by a PD carrier 11, an etalon filter 13, a PD 15 supported by a PD carrier 14, all of which are disposed within the housing 1.

The housing 1 includes the lid 1a, a bottom plate 1b, and a sidewall portion 1c. The sidewall portion 1c on the right side of FIG. 1B is provided with a holder unit 1d, in which a condenser lens 16 is accommodated and to which an end of an optical fiber 17 is inserted and fixed. The housing 1 is sealed airtight, so that the inner space is isolated from the outside environment. The bottom plate 1b is made of a material having high thermal conductivity, such as copper-tungsten (CuW), copper-molybdenum (CuMo), or aluminum oxide ($Al_2O_3$). The other portions (for example, the lid 1a, the sidewall portion 1c, and the holder unit 1d) of the housing 1 are made of a material having a low coefficient of thermal expansion, such as a Fe—Ni—Co alloy or aluminum oxide ($Al_2O_3$).

The submount 2, on which the laser element 3 is to be placed, is made of a material having high thermal conductivity, such as aluminum oxide ($Al_2O_3$), aluminum nitride (AlN), boron nitride (BN), copper (Cu), or silicon (Si).

In some cases, for example, if the laser element 3 is a wavelength-tunable laser element, the laser element 3 is provided with a plurality of semiconductor lasers and an optical coupler that can combine laser beams output from the semiconductor lasers. In such cases, the laser element 3 is controlled by a controller so that the laser element 3 can switch among the semiconductor lasers to operate one of the semiconductor lasers and to change the wavelength of a laser beam L1 output from the laser element 3 through temperature change of the semiconductor lasers. The wavelength of the laser beam L1 is ranged within a wavelength band (for example, from 1520 nm to 1620 nm) used for optical communication. However, the laser element 3 is not limited to this configuration, and may have a configuration of, for example, a Vernier type wavelength-tunable laser. Alternatively, the laser element 3 may be a distributed feedback (DFB) laser, a distributed reflector (DR) laser, a distributed Bragg reflector (DBR) laser, or a Fabry-Perot laser.

The collimator lens 4 is disposed on the laser beam output side (front side) of the laser element 3. The collimator lens 4 converts the laser beam L1 output from the laser element 3 into parallel light rays.

The submount 2 and the collimator lens 4 are placed on the bottom plate 1b with a carrier placed on a thermoelectric element, such as a Peltier element, interposed therebetween. The thermoelectric element is supplied with a driving current by the controller to heat or cool the laser element 3 via the submount 2, and thus can adjust the temperature of the laser element 3. The carrier is made of a material having high thermal conductivity, such as aluminum oxide, aluminum nitride, boron nitride, copper, or silicon.

The beam splitter 5 is, for example, a half mirror that transmits most of the laser beam L1 converted into the parallel light rays by the collimator lens 4 to feed the laser beam L1 into the optical isolator 6, and reflects a portion of the laser beam L1 as a laser beam L2 toward the PD 12.

The optical isolator 6 transmits the laser beam L1 fed from the beam splitter 5 toward the condenser lens 7, and prevents light from passing from the condenser lens 7 side toward the beam splitter 5. With this, return light (reflected light and amplified spontaneous emission (ASE) light generated by the SOA 9) is prevented from entering the laser element 3. This effect contributes to stabilization of the operation of the laser element 3, and also contributes to narrowing of the linewidth of the laser beam L1.

The condenser lens 7 condenses the laser beam L1 having passed through the optical isolator 6, and feeds the condensed laser beam L1 into the SOA 9.

The submount 8, on which the SOA 9 is to be placed, is made of a material having high thermal conductivity, such as aluminum oxide, aluminum nitride, boron nitride, copper, or silicon.

The SOA 9 is provided separately from the laser element 3. The SOA 9 optically amplifies the laser beam L1 fed from the condenser lens 7, and outputs the amplified laser beam L1. The SOA 9 is supplied with a driving current by the controller to optically amplify the laser beam L1 so as to have a desired optical intensity.

The condenser lens 16 condenses the laser beam L1 optically amplified by the SOA 9, and optically couples the condensed laser beam L1 to the optical fiber 17. The optical fiber 17 transmits the laser beam L1 to, for example, a predetermined device.

The beam splitter 10 is disposed between the beam splitter 5 and the PD 12. The beam splitter 10 is, for example, a half mirror that transmits most of the laser beam L2 reflected by the beam splitter 5 to feed the laser beam L2 into the PD 12, and reflects a portion of the laser beam L2 as a laser beam L3 to the etalon filter 13.

The PD 12 detects the intensity of the laser beam L2, and outputs an electrical signal corresponding to the detected intensity to the controller.

The etalon filter 13 has a periodical transmission characteristic with respect to the wavelength (transmission wavelength characteristic), and at a transmissivity corresponding to the transmission wavelength characteristic, selectively transmits the laser beam L3 reflected by the beam splitter 10 to feed the transmitted laser beam L3 into the PD 15. The PD 15 detects the intensity of the laser beam L3 having passed through the etalon filter 13, and outputs an electrical signal corresponding to the detected intensity to the controller.

The beam splitters 5 and 10, the optical isolator 6, the condenser lens 7, the submount 8, and the PD carriers 11 and 14 are placed on the bottom plate 1b with a carrier placed on a thermoelectric element, such as a Peltier element, interposed therebetween. The thermoelectric element is supplied with a driving current by the controller to heat or cool the SOA 9 via the submount 8, and thus can adjust the temperature of the SOA 9. The carrier is made of a material having high thermal conductivity, such as aluminum oxide, aluminum nitride, boron nitride, copper, or silicon.

The intensities of the laser beams L2 and L3 detected by the PDs 12 and 15, respectively, are used for wavelength locking control (control to cause the laser beam L1 output from the laser element 3 to have a desired wavelength) performed by the controller.

Specifically, in the wavelength locking control, the controller performs control to change the driving current and the temperature of the laser element 3 such that the ratio between the intensity of the laser beam L2 detected by the PD 12 and the intensity of the laser beam L3 detected by the PD 15 after the laser beam L3 passes through the etalon filter 13 is equal to a ratio therebetween obtained at the time when the intensity and the wavelength of the laser beam L1 are equal to desired intensity and wavelength. With this control, the wavelength of the laser beam L1 can be controlled to the desired wavelength (locked wavelength).

FIG. 1C is a diagram illustrating a surface (inner surface) of the lid 1a inside the housing 1. The lid 1a is a plate-like member made of a material having a low coefficient of thermal expansion, such as a Fe—Ni—Co alloy or aluminum oxide, with the inner surface thereof plated with gold (Au). The inner surface of the lid 1a has a weld area 1aa, an elevated surface area 1ab, and a reduced optical reflection area 1ac. The weld area 1aa is an area for welding the lid 1a to an upper end surface of the sidewall portion 1c of the housing 1 to airtightly seal the inside of the housing 1. The gold plating is also applied to the upper end surface of the sidewall portion 1c of the housing 1, and the lid 1a is joined to the sidewall portion 1c with seam welding using gold-to-gold welding.

The elevated surface area 1ab is an area elevated with respect to the weld area 1aa. The elevated surface area 1ab facilitates positioning when the lid 1a is mounted on the housing 1.

The reduced optical reflection area 1ac is a partial area of the inner surface of the lid 1a included in the inner surface of the housing 1, and is a partial area in the elevated surface area 1ab. The reduced optical reflection area 1ac is an area of the elevated surface area 1ab provided by being processed so as to absorb light and have a rough surface. Accordingly, the base of the reduced optical reflection area 1ac is plated with gold, and the gold plating is applied to the elevated surface area 1ab located around the reduced optical reflection area 1ac.

In the housing 1 of the semiconductor laser module 100, the laser element 3 and the SOA 9 are disposed as optical elements that emit light in the housing 1. The laser element 3 outputs the laser beam L1. A portion of the laser beam L1 is reflected to be stray light in the housing 1. The SOA 9 emits the ASE light in a wavelength band including the wavelength of the laser beam L1, and the ASE light is emitted in all directions and reflected to be the stray light. Metal surfaces and white surfaces present in the housing 1 cause the generation of the stray light. For example, the optical isolator 6 includes a metal surface on the outer circumference thereof, and also, aluminum oxide, aluminum nitride, and boron nitride exemplified as constituent materials of members serving as support elements, for example, the submounts 2 and 8, the PD carriers 11 and 14, the carriers, and the like are often nearly white.

The inner surface of the lid 1a is plated with gold, and therefore, has high reflectivity of light, being likely to generate the stray light.

In contrast, the semiconductor laser module 100 includes the reduced optical reflection area 1ac at a portion of the inner surface of the lid 1a included in the inner surface of the housing 1. Therefore, when the light emitted from the above-mentioned optical elements reaches the reduced optical reflection area 1ac, the light is absorbed there. In addition, since having the rough surface, the reduced optical reflection area 1ac has higher optical absorbance than that of a smooth surface, and scatters the light so as to be dispersed, thus being an area having lower reflectivity. As a result, the intensity of the stray light is reduced.

The reduced optical reflection area 1ac is provided over the laser element 3, the collimator lens 4, the beam splitter 5, the optical isolator 6, the condenser lens 7, the SOA 9, the beam splitter 10, the PD carrier 11, the etalon filter 13, the PD carrier 14, and the PD 15. With this arrangement, when light emitted or reflected by the above-listed elements other than the PDs 12 and 15 travels toward the lid 1a, the light is likely to reach the reduced optical reflection area 1ac, and likely to be reduced by the reduced optical reflection area 1ac.

The surface roughness of the reduced optical reflection area 1ac is preferably, for example, such that an arithmetical mean roughness Ra defined in JIS B 0601: 2000 is in a range of $0.05\ \mu m \leq Ra \leq 10\ \mu m$. When $0.05\ \mu m \leq Ra$, the effects of the increase in the optical absorbance and the reduction in the optical reflection amount are suitably brought about. When the arithmetical mean roughness Ra is too large, a flat surface may be locally present in the roughened surface, and the flat surface may reflect the light. However, when $Ra \leq 10\ \mu m$, such a flat surface is sufficiently unlikely to be present.

The reduced optical reflection area 1ac is preferably provided by surface-treating the gold-plated surface on the inner surface of the lid 1a by emitting thereto a laser beam for processing. When energy is given to the gold-plated surface by the laser beam for processing, a chemical reaction such as oxidation occurs to make the gold-plated surface blackish. As a result, the gold-plated surface increases in optical absorption coefficient, and is roughened. The phenomenon of such an increase in the optical absorption coefficient and the roughening of the surface occurs even when the gold-plated layer has a thickness of several micrometers. The wavelength and the intensity of the laser beam for processing only need to be set so as to achieve desired values of the absorption coefficient and the surface roughness according to the material to be surface-treated.

To provide the reduced optical reflection area 1ac at a desired area, it is preferable to provide the reduced optical reflection area 1ac by performing the surface treatment by emitting the laser beam for processing because the area to be provided as the reduced optical reflection area 1ac can be freely and accurately set. For example, the reduced optical reflection area 1ac can be more surely provided so as not to overlap the weld area 1aa. If, instead, for example, a coating is applied to reduce the stray light, a coating agent may spread out into the weld area of the lid. Such outspreading causes a welding defect. If the welding defect occurs, the housing may be insufficiently sealed to generate leakage, so that the manufacturing yield of the semiconductor laser module may be reduced.

Since the reduced optical reflection area 1ac is provided by processing the constituent material of the lid 1a, no additional member is required, and the component cost can be prevented from increasing. In addition, an organic resin such as the coating agent is not used as a raw material. Therefore, even if the stray light has a high intensity, the reduced optical reflection area 1ac is not damaged by burning or strong oxidation to result in breakage when being irradiated with the stray light.

When a pulsed laser beam is used as the laser beam for processing, heat generated on the irradiated surface by the irradiation with the pulsed laser beam easily diffuses. As a result, the irradiated surface can be prevented from being excessively processed or being broken by being heated. The wavelength, the peak power, and the duty ratio of the pulsed laser beam are adjusted to restrain the irradiated surface from an excessive temperature rise, and thus, suitable processing can be performed. According to the study of the inventors of the present disclosure, when the pulsed laser beam is used as the laser beam for processing, unevenness is formed on the irradiated surface at a period (approximately from 0.5 μm to 1.5 μm) reflecting the wavelength of the laser beam. This unevenness is preferable from the viewpoint of the surface roughening.

As described above, the semiconductor laser module 100 according to the first embodiment can suitably achieve the reduction of the stray light in the housing 1.

Second Embodiment

Figure 2A:
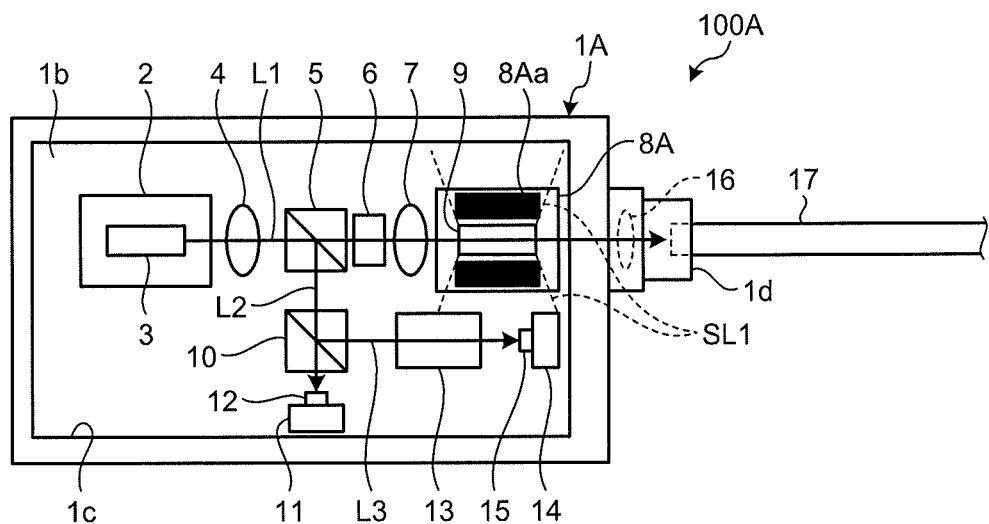
FIG. 2A is a schematic diagram illustrating a configuration of an optical module according to a second embodiment of the present disclosure.
Figure 2B:
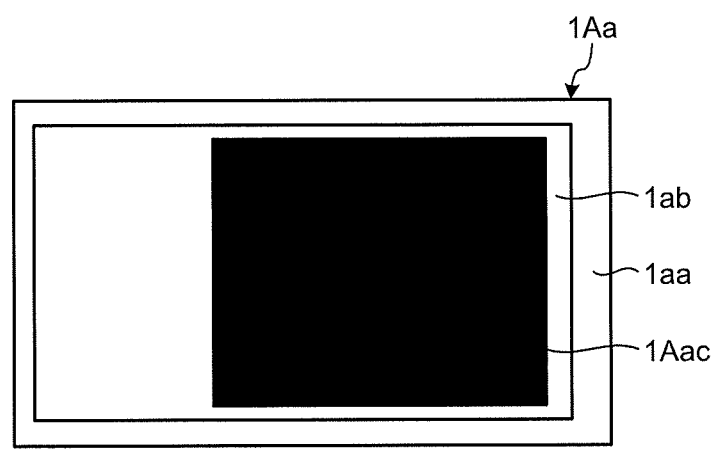
FIG. 2B is another schematic diagram illustrating the configuration of the optical module according to the second embodiment.

FIGS. 2A and 2B are schematic diagrams each illustrating a configuration of a semiconductor laser module serving as an optical module according to a second embodiment of the present disclosure. A semiconductor laser module 100A according to the second embodiment has a configuration obtained by replacing the housing 1 with a housing 1A and replacing the submount 8 with a submount 8A in the configuration of the semiconductor laser module 100 according to the first embodiment. The housing 1A has a configuration obtained by replacing the lid 1a of the housing 1 with a lid 1Aa.

FIG. 2A is a top view of the semiconductor laser module 100A with the lid 1Aa removed from the housing 1A. FIG. 2B is a diagram illustrating an inner surface of the lid 1Aa. In the same way as the submount 8, the submount 8A is made of a material having high thermal conductivity, such as aluminum oxide, aluminum nitride, boron nitride, copper, or silicon. Partial areas of a surface of the submount 8A, that is, both sides of an area in which the SOA 9 is to be placed with respect to a traveling direction of the laser beam L1 serve as reduced optical reflection areas 8Aa. The reduced optical reflection areas 8Aa are areas of the surface of the submount 8A provided by being processed so as to absorb light and have rough surfaces.

The SOA 9 emits, for example, the ASE light as stray light SL1, as indicated by dashed lines. The stray light SL1 is, however, absorbed by the reduced optical reflection areas 8Aa, and thereby, reflection by the submount 8A is reduced. This results in a reduction of the stray light. In particular, the effect of the stray light absorption is significant when the SOA 9 is mounted junction-down on the submount 8A. The characteristics, such as the surface roughness, and the method of providing the reduced optical reflection areas 8Aa are the same as those for the reduced optical reflection area 1ac of the lid 1a in the first embodiment. For example, by surface-treating the surface of the submount made of aluminum oxide by emitting thereto the laser beam for processing, energy is given to the surface of aluminum oxide, and a chemical reaction occurs to increase the optical absorption coefficient and roughen the surface. With this processing, the submount 8A having the reduced optical reflection areas 8Aa can be produced.

In the same way as the lid 1a, the lid 1Aa is a plate-like member made of a material having a low coefficient of thermal expansion, such as a Fe—Ni—Co alloy or aluminum oxide, with the inner surface thereof plated with gold. The inner surface of the lid 1Aa has the weld area 1aa, the elevated surface area 1ab, and a reduced optical reflection area 1Aac.

The reduced optical reflection area 1Aac has a smaller area than that of the reduced optical reflection area 1ac of the lid 1a. Specifically, the reduced optical reflection area 1Aac is not provided over the laser element 3, but provided over the collimator lens 4, the beam splitter 5, the optical isolator 6, the condenser lens 7, the SOA 9, the beam splitter 10, the PD carrier 11, the PD 12, the etalon filter 13, the PD carrier 14, and the PD 15. Elements other than the PDs 12 and 15 among the above-listed elements are more likely to generate the stray light than the PDs 12 and 15. Therefore, the reduced optical reflection area 1Aac is effectively present only over those elements from the viewpoint of reduction of the stray light.

Figure 3:
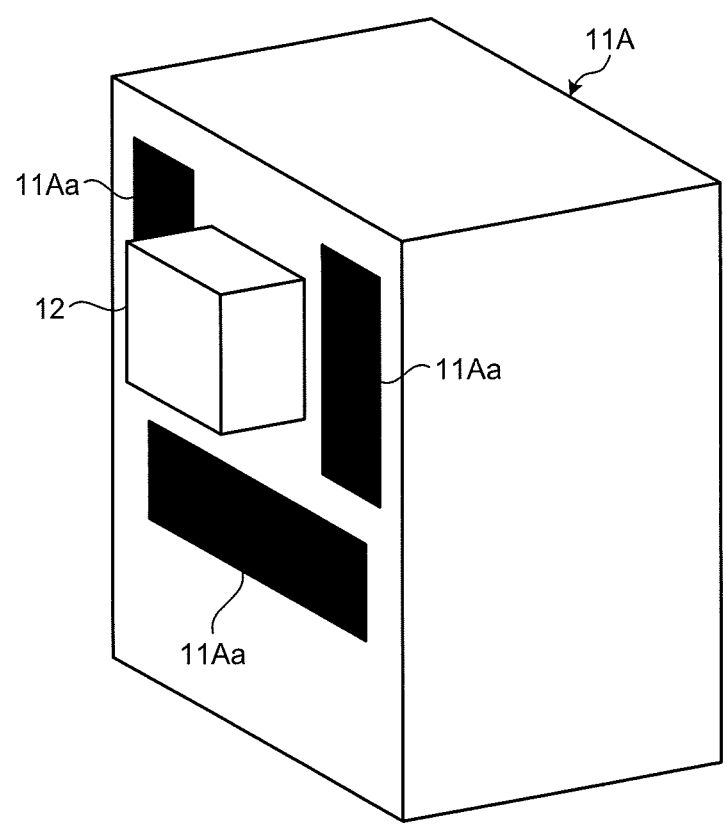
FIG. 3 is a schematic diagram illustrating a configuration example of a PD carrier.

For example, the PD 12 is an optical element different from optical elements that emit light. A PD carrier 11A such as that illustrated in FIG. 3 may be used instead of the PD carrier 11 that supports the PD 12. Partial areas of a surface of the PD carrier 11A, that is, areas around an area in which the PD 12 is to be placed serve as reduced optical reflection areas 11Aa. The reduced optical reflection areas 11Aa are areas of the surface of the PD carrier 11A provided by being processed so as to absorb light and have rough surfaces. With this configuration, even when the laser beam L2 to be fed into the PD 12 is emitted to the surface of the PD carrier 11A around the PD 12, the reduced optical reflection areas 11Aa are mainly irradiated therewith. Thus, the stray light is reduced. In general, to increase accuracy of positioning, the beam diameter of light incident on a PD is often designed to be larger than the light-receiving diameter of the PD. Therefore, the light that is incident on and reflected by the PD carrier often may become the stray light. In particular, an increase in output level increases the amount of the stray light caused by the light reflected by the PD carrier. Therefore, it is effective to configure the PD carrier as illustrated in FIG. 3 to take measures to reduce the stray light. Although the PD carrier 11A is a small component, the reduced optical reflection areas 11Aa can be irradiated with the laser beam for processing to be provided in desired positions at high positional accuracy. The PD carrier 14 may be replaced with a PD carrier provided with reduced optical reflection areas, in the same way as the PD carrier 11A. Also in the following embodiments, the PD carrier may be replaced with a PD carrier provided with reduced optical reflection areas, in the same way as the PD carrier 11A.

Third Embodiment

Figure 4:
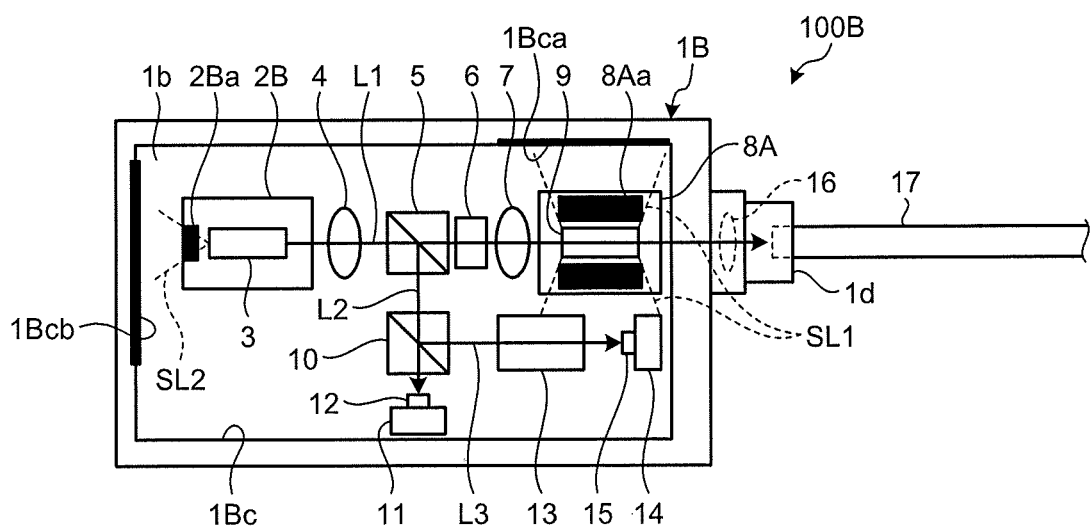
FIG. 4 is a schematic diagram illustrating a configuration of an optical module according to a third embodiment of the present disclosure.

FIG. 4 is a schematic diagram illustrating a configuration of a semiconductor laser module serving as an optical module according to a third embodiment of the present disclosure, and is a top view of the semiconductor laser module with a lid removed. A semiconductor laser module 100B according to the third embodiment has a configuration obtained by replacing the housing 1A with a housing 1B and replacing the submount 2 with a submount 2B in the configuration of the semiconductor laser module 100A according to the second embodiment. The housing 1B has a configuration obtained by replacing the sidewall portion 1c of the housing 1A with a sidewall portion 1Bc.

In the same way as the submount 2, the submount 2B is made of a material having high thermal conductivity, such as aluminum oxide, aluminum nitride, boron nitride, copper, or silicon. A partial area of a surface of the submount 2B, that is, a rear side of an area in which the laser element 3 is to be placed (a side of the laser element 3 opposite to an output end of the laser beam L1) serves as a reduced optical reflection area 2Ba. The reduced optical reflection area 2Ba is an area of the surface of the submount 2B provided by being processed so as to absorb light and have a rough surface.

The laser element 3 emits a laser beam as stray light SL2 from a rear end surface thereof, as indicated by dashed lines. The stray light SL2 is, however, absorbed and scattered by the reduced optical reflection area 2Ba, and thereby, reflection by the submount 2B is reduced. This results in a reduction of the stray light. The characteristics, such as the surface roughness, and the method of providing the reduced optical reflection area 2Ba are the same as those for the reduced optical reflection areas 8Aa of the submount 8A.

The sidewall portion 1Bc is made of a material having a low coefficient of thermal expansion, such as a Fe—Ni—Co alloy or aluminum oxide, and partial areas of surfaces thereof serve as reduced optical reflection areas 1Bca and 1Bcb.

The reduced optical reflection area 1Bca is an area on a side surface side of the submount 8A, and is provided in an area on a side opposite to a side on which, for example, the etalon filter 13 is disposed. The stray light SL1 reaches the reduced optical reflection area 1Bca. The stray light SL1 is, however, absorbed and scattered by the reduced optical reflection area 1Bca, and thereby, reflection by the sidewall portion 1Bc is reduced. This results in a reduction of the stray light.

The reduced optical reflection area 1Bcb is provided in an area on a rear side of the submount 2B. The stray light SL2 reaches the reduced optical reflection area 1Bcb. The stray light SL2 is, however, absorbed and scattered by the reduced optical reflection area 1Bcb, and thereby, the reflection by the sidewall portion 1Bc is reduced. This results in a reduction of the stray light.

The characteristics, such as the surface roughness, and the method of providing the reduced optical reflection areas 1Bca and 1Bcb are the same as those for the reduced optical reflection area 1ac of the lid 1a according to the first embodiment. For example, by surface-treating the surfaces of the sidewall portion made of a Fe—Ni—Co alloy or aluminum oxide by emitting thereto the laser beam for processing, energy is given to the surfaces of the Fe—Ni—Co alloy or aluminum oxide, and a chemical reaction occurs to increase the optical absorption coefficient and roughen the surfaces. With this processing, the sidewall portion 1Bc having the reduced optical reflection areas 1Bca and 1Bcb can be produced.

The housing 1B in the semiconductor laser module 100B includes the lid 1Aa, which may, however, be replaced with the lid 1a illustrated in FIG. 1C.

Fourth Embodiment

Figure 5:
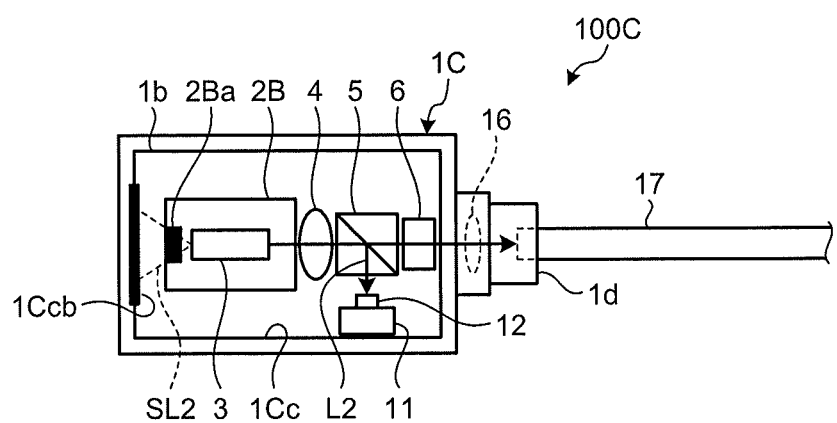
FIG. 5 is a schematic diagram illustrating a configuration of an optical module according to a fourth embodiment of the present disclosure.

FIG. 5 is a schematic diagram illustrating a configuration of a semiconductor laser module serving as an optical module according to a fourth embodiment of the present disclosure, and is a top view of the semiconductor laser module with a lid removed. A semiconductor laser module 100C according to the fourth embodiment has a configuration obtained by replacing the housing 1B with a housing 1C and eliminating the condenser lens 7, the submount 8A, the SOA 9, the beam splitter 10, the etalon filter 13, the PD carrier 14, and the PD 15 in the configuration of the semiconductor laser module 100B according to the third embodiment. The housing 1C has a configuration obtained by replacing the sidewall portion 1Bc of the housing 1B with a sidewall portion 1Cc.

The semiconductor laser module 100C does not perform the wavelength locking control. The electrical signal output from the PD 12 is used to perform constant output control of the laser element 3.

The sidewall portion 1Cc is made of a material having a low coefficient of thermal expansion, such as a Fe—Ni—Co alloy or aluminum oxide, and a partial area of a surface thereof serves as a reduced optical reflection area 1Ccb.

The reduced optical reflection area 1Ccb is provided in an area on a rear side of the submount 2B. The stray light SL2 reaches the reduced optical reflection area 1Ccb. The stray light SL2 is, however, absorbed and scattered by the reduced optical reflection area 1Ccb, and thereby, reflection by the sidewall portion 1Cc is reduced. This results in a reduction of the stray light.

The characteristics, such as the surface roughness, and the method of providing the reduced optical reflection area 1Ccb are the same as those for the reduced optical reflection areas 1Bca and 1Bcb of the sidewall portion 1Bc according to the third embodiment.

A same lid as, for example, the lid 1a illustrated in FIG. 1C or the lid 1Aa illustrated in FIG. 2B can be used as a lid of the housing 1C in the semiconductor laser module 100C. A reduced optical reflection area of this lid may be provided over the laser element 3, the collimator lens 4, the beam splitter 5, the optical isolator 6, the PD carrier 11, and the PD 12, but need not be provided over the laser element 3.

Fifth Embodiment

Figure 6:
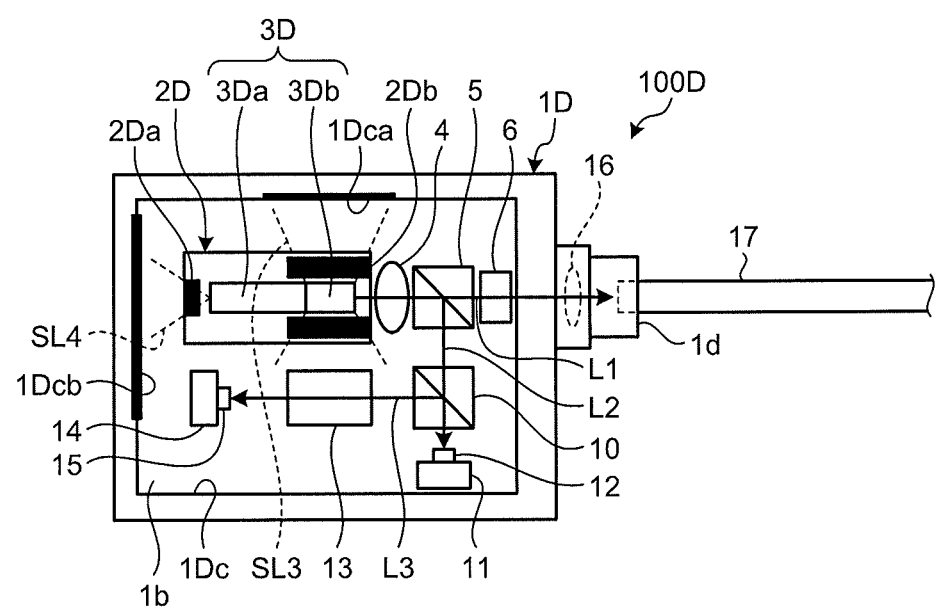
FIG. 6 is a schematic diagram illustrating a configuration of an optical module according to a fifth embodiment of the present disclosure.

FIG. 6 is a schematic diagram illustrating a configuration of a semiconductor laser module serving as an optical module according to a fifth embodiment of the present disclosure, and is a top view of the semiconductor laser module with a lid removed. A semiconductor laser module 100D according to the fifth embodiment has a configuration obtained by replacing the housing 1A with a housing 1D, replacing the submount 2 with a submount 2D, and replacing the laser element 3 with a laser element 3D in the configuration of the semiconductor laser module 100A according to the second embodiment. The housing 1D has a configuration obtained by replacing the sidewall portion 1c of the housing 1A with a sidewall portion 1Dc.

The laser element 3D is an element that has a configuration obtained by integrating a laser unit 3Da having the same configuration as that of the laser element 3 with an SOA unit 3Db having the same configuration as that of the SOA 9, and outputs the laser beam L1 from the SOA unit 3Db.

The submount 2D, on which the laser element 3D is to be placed, is made of a material having high thermal conductivity, such as aluminum oxide, aluminum nitride, boron nitride, copper, or silicon, in the same way as the submount 2. A partial area of a surface of the submount 2D, that is, a rear side of an area in which the laser element 3D is to be placed (a side of the laser element 3D opposite to an output end thereof for the laser beam L1) serves as a reduced optical reflection area 2Da. Portions of the submount 2D on both sides of the SOA unit 3Db with respect to the traveling direction of the laser beam L1 serve as reduced optical reflection areas 2Db. The reduced optical reflection areas 2Da and 2Db are areas of the surface of the submount 2D provided by being processed so as to absorb light and have rough surfaces.

The SOA unit 3Db emits stray light SL3, as indicated by dashed lines. The stray light SL3 is, however, absorbed and scattered by the reduced optical reflection areas 2Db. The laser unit 3Da emits stray light SL4. The stray light SL4 is, however, absorbed and scattered by the reduced optical reflection area 2Da. As a result, reflection by the submount 2D is reduced. This results in a reduction of the stray light. The characteristics, such as the surface roughness, and the method of providing the reduced optical reflection areas 2Da and 2Db are the same as those for the reduced optical reflection areas 8Aa of the submount 8A.

The sidewall portion 1Dc is made of a material having a low coefficient of thermal expansion, such as a Fe—Ni—Co alloy or aluminum oxide, and partial areas of surfaces thereof serve as reduced optical reflection areas 1Dca and 1Dcb.

The reduced optical reflection area 1Dca is an area on a side surface side of the submount 2D, and is provided in an area on a side opposite to a side on which, for example, the etalon filter 13 is to be disposed. The stray light SL3 reaches the reduced optical reflection area 1Dca. The stray light SL3 is, however, absorbed and scattered by the reduced optical reflection area 1Dca, and thereby, reflection by the sidewall portion 1Dc is reduced. This results in a reduction of the stray light.

The reduced optical reflection area 1Dcb is provided in an area on a rear side of the submount 2D. The stray light SL4 reaches the reduced optical reflection area 1Dcb. The stray light SL4 is, however, absorbed and scattered by the reduced optical reflection area 1Dcb, and thereby, the reflection by the sidewall portion 1Dc is reduced. This results in a reduction of the stray light. The characteristics, such as the surface roughness, and the method of providing the reduced optical reflection areas 1Dca and 1Dcb are the same as those for the reduced optical reflection area 1ac of the lid 1a according to the first embodiment.

Sixth Embodiment

Figure 7:
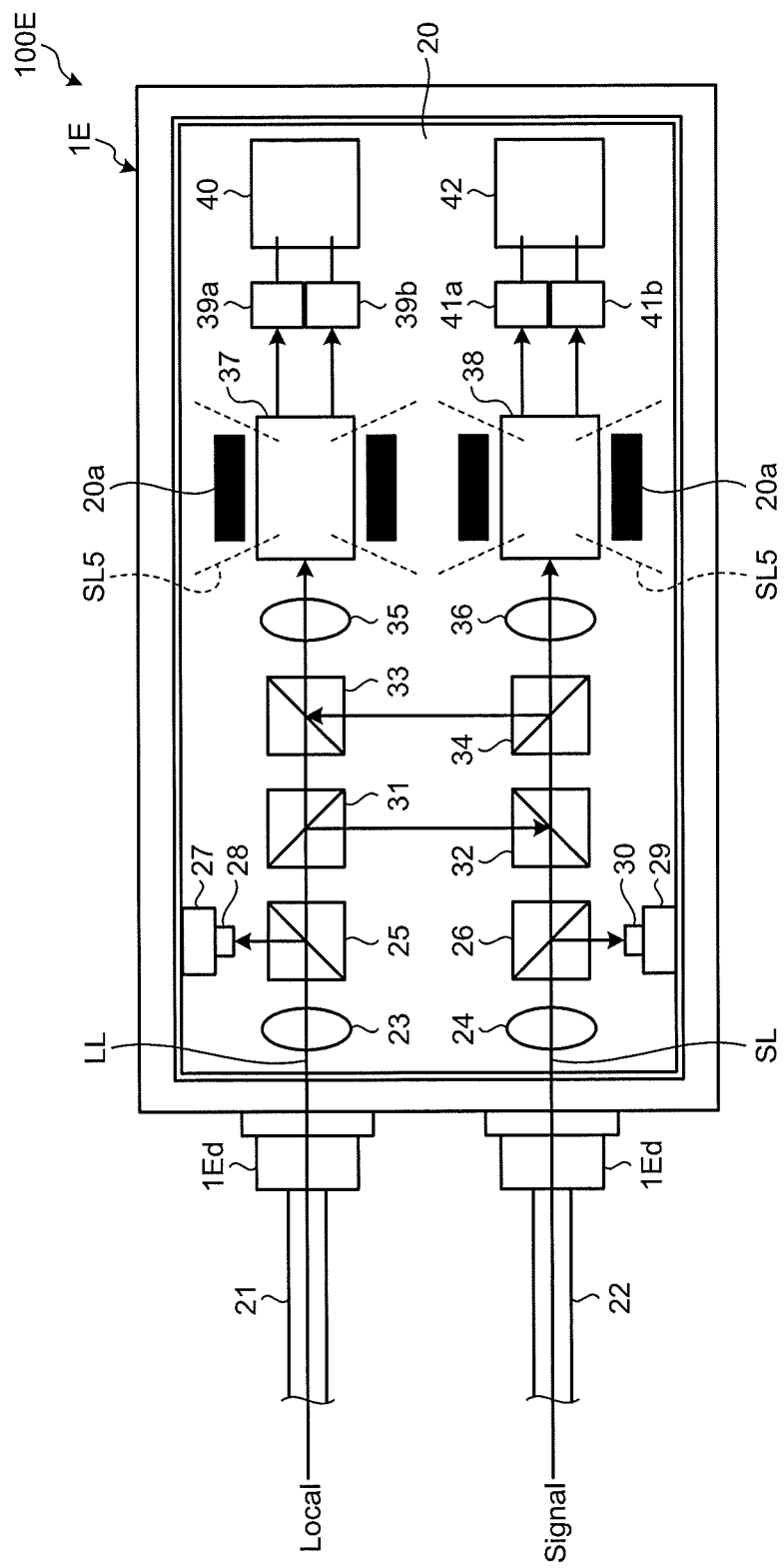
FIG. 7 is a schematic diagram illustrating a configuration of an optical module according to a sixth embodiment of the present disclosure.

FIG. 7 is a schematic diagram illustrating a configuration of an optical receiver module serving as an optical module according to a sixth embodiment of the present disclosure, and is a top view of the optical receiver module with a lid of a housing of the module removed. An optical receiver module 100E is used in a communication system using a coherent modulation system. The optical receiver module 100E is provided with a housing 1E. The housing 1E is provided with two holder units 1Ed, into which respective ends of optical fibers 21 and 22 are inserted and fixed.

The optical receiver module 100E is provided with a carrier 20 serving as a support element disposed at the bottom in the housing 1E. The optical receiver module 100E is further provided with collimator lenses 23 and 24, beam splitters 25 and 26, a PD 28 supported by a PD carrier 27, a PD 30 supported by a PD carrier 29, polarization beam splitters (PBS) 31 and 34, beam splitters 32 and 33, condenser lenses 35 and 36, 90-degree hybrid elements 37 and 38 of a waveguide type, balanced PDs 39a and 39b and an electrical amplifier 40 connected thereto, and balanced PDs 41a and 41b and an electrical amplifier 42 connected thereto, all of which are placed on the carrier 20. The carrier 20 is made of a material having high thermal conductivity, such as aluminum oxide, aluminum nitride, boron nitride, copper, or silicon.

The optical fiber 21 introduces local oscillator light LL serving as a linearly polarized wave into the housing 1E. The collimator lens 23 converts the local oscillator light LL into parallel light rays. The beam splitter 25 transmits most of the local oscillator light LL, and reflects a portion thereof toward the PD 28. The PBS 31 separates the local oscillator light LL into an X-polarized wave and a Y-polarized wave. The X-polarized wave of the local oscillator light LL passes through the beam splitter 33, and is condensed by the condenser lens 35 and fed into the 90-degree hybrid element 37. The Y-polarized wave of the local oscillator light LL is reflected by the beam splitter 32, passes through the PBS 34, and is condensed by the condenser lens 36 and fed into the 90-degree hybrid element 38.

The optical fiber 22 introduces signal light SL serving as any polarized wave that is modulated using, for example, dual-polarization quadrature-phase shift key (DP-QPSK) modulation into the housing 1E. The collimator lens 24 converts the signal light SL into parallel light rays. The beam splitter 26 transmits most of the signal light SL, and reflects a portion thereof toward the PD 30. The beam splitter 32 transmits the signal light SL. The PBS 34 separates the signal light SL into the X-polarized wave and the Y-polarized wave. The X-polarized wave of the signal light SL is reflected by the PBS 34, further reflected by the beam splitter 33 and then condensed by the condenser lens 35, and is fed into the 90-degree hybrid element 37. The Y-polarized wave of the signal light SL passes through the PBS 34, is condensed by the condenser lens 36, and fed into the 90-degree hybrid element 38.

The 90-degree hybrid element 37 makes the X-polarized wave of the local oscillator light LL interfere with the X-polarized wave of the signal light SL, and outputs the interference light to the balanced PDs 39a and 39b. The 90-degree hybrid element 38 makes the Y-polarized wave of the local oscillator light LL interfere with the Y-polarized wave of the signal light SL, and outputs the interference light to the balanced PDs 41a and 41b. The balanced PDs 39a, 39b, 41a, and 41b receive the interference light, and can thereby separate the modulated signals into I-channel signals and Q-channel signals to take out the signals as electrical signals. The taken-out electrical signals are output to the respective electrical amplifiers 40 and 42 to be amplified therein, and are output to an optical signal processing device.

The 90-degree hybrid elements 37 and 38 output, as stray light SL5, non-coupled light, which has not coupled to waveguides, among the local oscillator light LL and the signal light SL. In other words, the 90-degree hybrid elements 37 and 38 are optical elements that emit the light in the housing 1E.

In response to this, partial areas of a surface of the carrier 20, that is, both sides of an area, in which each of the 90-degree hybrid elements 37 and 38 is to be placed, serve as reduced optical reflection areas 20a. The reduced optical reflection areas 20a are areas of the surface of the carrier 20 provided by being processed so as to absorb light and have rough surfaces. The stray light SL5 is absorbed and scattered by the reduced optical reflection areas 20a, and thereby, reflection by the carrier 20 is reduced. This results in a reduction of the stray light.

Seventh Embodiment

Figure 8:
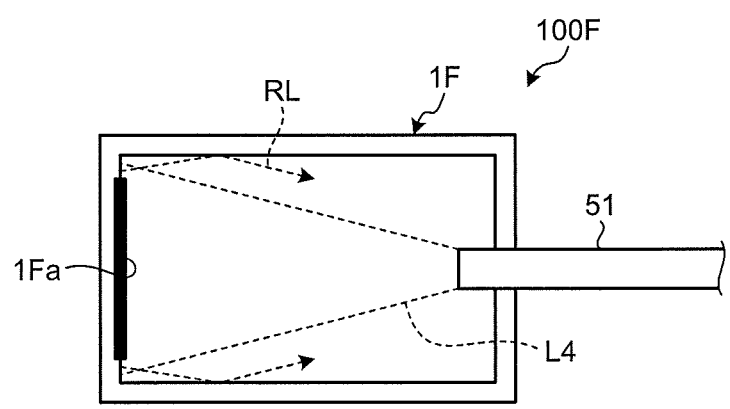
FIG. 8 is a schematic diagram illustrating a configuration of an optical module according to a seventh embodiment of the present disclosure.

FIG. 8 is a schematic diagram illustrating a configuration of an optical fiber termination module serving as an optical module according to a seventh embodiment of the present disclosure. An optical fiber termination module 100F is provided with a housing 1F and an optical fiber 51 serving as an optical element with one end disposed in the housing 1F. The housing 1F is made of a material having high thermal conductivity, such as aluminum oxide ($Al_2O_3$), aluminum nitride (AlN), boron nitride (BN), copper (Cu), or silicon (Si). The optical fiber 51 constitutes an end portion of, for example, a fiber laser or an optical fiber amplifier, and emits high-power light L4 in the housing 1F. The light L4 is unwanted light, and is processing target light to be processed in the optical fiber termination module 100F.

A portion of an inner surface of the housing 1F is provided with a reduced optical reflection area 1Fa. The reduced optical reflection area 1Fa is an area of the inner surface of the housing 1F provided by being processed so as to absorb 15% or more of incident light and have a rough surface.

Therefore, when the light L4 emitted from the optical fiber 51 reaches the reduced optical reflection area 1Fa, the light is absorbed there. In addition, since having the rough surface, the reduced optical reflection area 1Fa scatters the light so as to be dispersed, thus being an area having lower reflectivity. Since the reduced optical reflection area 1Fa is provided at only a portion of the inner surface of the housing 1F, a portion of the light L4 not emitted to the reduced optical reflection area 1Fa is not absorbed and becomes reflected light RL, which is repeatedly reflected to reach the reduced optical reflection area 1Fa and be absorbed there. In this case, while the reduced optical reflection area 1Fa absorbs the light L4 and increases in temperature, areas other than the reduced optical reflection area 1Fa do not absorb the light, and therefore, do not increase in temperature. As a result, the heat generated in the reduced optical reflection area 1Fa can be diffused to the areas other than the reduced optical reflection area 1Fa, so that the reduced optical reflection area 1Fa is restrained from excessively increasing in temperature and thus restrained from decreasing in capability of processing the light L4.

The reflectivity of each of the above-described reduced optical reflection areas is preferably equal to or lower than −10 dB for the wavelengths of the stray light and the processing target light.

The present disclosure provides the effect that the unwanted light in the optical module can be reduced.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
a housing; and
an optical element disposed in the housing and configured to emit light in the housing, wherein
a partial area of a surface inside the housing serves as a reduced optical reflection area processed so as to absorb the light and have a rough surface.

2. The optical module according to claim 1, wherein the reduced optical reflection area constitutes a surface of a lid of the housing.

3. The optical module according to claim 2, wherein the lid contains an Fe—Ni—Co alloy or aluminum oxide.

4. The optical module according to claim 2, wherein an underlying layer of the reduced optical reflection area of the lid is made of plated gold, and an inner surface of the housing located around the reduced optical reflection area is plated with gold.

5. The optical module according to claim 1, wherein the optical element is a semiconductor laser element or a semiconductor optical amplifier.

6. The optical module according to claim 1, wherein the reduced optical reflection area is provided by surface-treating the surface inside the housing by emitting thereto a laser beam.

7. The optical module according to claim 6, wherein the laser beam is a pulsed laser beam.

8. The optical module according to claim 1, wherein reflectivity of the reduced optical reflection area is equal to or lower than −10 dB for a wavelength of the light.

9. An optical module comprising:
a housing;
an optical element disposed in the housing and configured to emit light in the housing; and
a member disposed in the housing, wherein
a partial area of a surface of the member serves as a reduced optical reflection area processed so as to absorb the light and have a rough surface.

10. The optical module according to claim 9, wherein the member is a support element that supports the optical element.

11. The optical module according to claim 9, further comprising another optical element, wherein
the member supports the other optical element.

12. The optical module according to claim 9, wherein the member contains aluminum oxide, aluminum nitride, boron nitride, copper, or silicon.

13. The optical module according to claim 9, wherein the optical element is a semiconductor laser element or a semiconductor optical amplifier.

14. The optical module according to claim 9, wherein the reduced optical reflection area is provided by surface-treating a surface of the member by emitting thereto a laser beam.

15. The optical module according to claim 14, wherein the laser beam is a pulsed laser beam.

16. The optical module according to claim 9, wherein reflectivity of the reduced optical reflection area is equal to or lower than −10 dB for a wavelength of the light.

* * * * *